US009177880B2

(12) United States Patent
Kubiak

(10) Patent No.: US 9,177,880 B2
(45) Date of Patent: Nov. 3, 2015

(54) HOUSING FOR A SEMICONDUCTOR CHIP AND SEMICONDUCTOR CHIP WITH A HOUSING

(75) Inventor: Michael Kubiak, Berlin (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/127,451

(22) PCT Filed: Jul. 26, 2012

(86) PCT No.: PCT/EP2012/064724
§ 371 (c)(1),
(2), (4) Date: Mar. 14, 2014

(87) PCT Pub. No.: WO2013/017530
PCT Pub. Date: Feb. 7, 2013

(65) Prior Publication Data
US 2014/0217523 A1 Aug. 7, 2014

(30) Foreign Application Priority Data
Jul. 29, 2011 (DE) .......................... 10 2011 109 006

(51) Int. Cl.
H01L 23/045 (2006.01)
B81B 7/00 (2006.01)
H01L 29/84 (2006.01)

(52) U.S. Cl.
CPC ............. *H01L 23/045* (2013.01); *B81B 7/007* (2013.01); *H01L 29/84* (2013.01); *B81B 2207/092* (2013.01); *B81B 2207/096* (2013.01); *B81B 2207/097* (2013.01); *H01L 2224/32225* (2013.01); *H01L 2224/48091* (2013.01); *H01L 2224/48227* (2013.01); *H01L 2224/73265* (2013.01)

(58) Field of Classification Search
CPC ..... G09G 5/02; G09G 3/3607; G09G 3/2003; G02F 1/133514
See application file for complete search history.

(56) References Cited

U.S. PATENT DOCUMENTS

| 5,220,488 | A  | * | 6/1993  | Denes ............................ 361/749 |
| 5,596,231 | A  | * | 1/1997  | Combs ............................ 257/776 |
| 6,093,960 | A  | * | 7/2000  | Tao et al. ........................ 257/706 |
| 6,297,543 | B1 | * | 10/2001 | Hong et al. ..................... 257/666 |
| 6,518,088 | B1 |   | 2/2003  | Heerman et al. |
| 6,919,631 | B1 | * | 7/2005  | Hoffman et al. ............... 257/707 |
| 7,055,391 | B2 |   | 6/2006  | Tokuhara |
| 7,126,218 | B1 | * | 10/2006 | Darveaux et al. ............. 257/706 |
| 8,007,704 | B2 | * | 8/2011  | Smith et al. ................. 264/272.11 |
| 8,809,689 | B2 | * | 8/2014  | Olden et al. ..................... 174/254 |
| 2007/0210392 | A1 |   | 9/2007  | Sakakibara et al. |
| 2008/0128886 | A1 |   | 6/2008  | Kang et al. |
| 2008/0290351 | A1 | * | 11/2008 | Ajiki et al. ..................... 257/88 |
| 2009/0039530 | A1 | * | 2/2009  | Fryklund et al. ............... 257/778 |

(Continued)

FOREIGN PATENT DOCUMENTS

| DE | 10353139 A1 | 6/2005 |
| DE | 10355921 A1 | 6/2005 |
| DE | 202005011253 U1 | 11/2005 |

(Continued)

*Primary Examiner* — William Coleman
(74) *Attorney, Agent, or Firm* — Slater & Matsil, L.L.P.

(57) ABSTRACT

A housing for a semiconductor chip has an injection molded body, in which an accommodating area for accommodating the semiconductor chip is provided. The injection-molded body has at least one metallization for making electrical contact with the semiconductor chip.

20 Claims, 3 Drawing Sheets

(56) References Cited

U.S. PATENT DOCUMENTS

2009/0199632 A1* 8/2009 Toyoda .................... 73/204.26
2010/0067732 A1 3/2010 Hachinohe et al.

FOREIGN PATENT DOCUMENTS

| | | |
|---|---|---|
| DE | 102005046008 A1 | 3/2007 |
| JP | 63291440 A | 11/1988 |
| JP | 2001281086 A | 10/2001 |
| JP | 2004279091 A | 10/2004 |
| JP | 2005221260 A | 8/2005 |
| JP | 2005332957 A | 12/2005 |
| JP | 2007158216 A | 6/2007 |
| JP | 200938077 A | 2/2009 |
| JP | 201068446 A | 3/2010 |

* cited by examiner

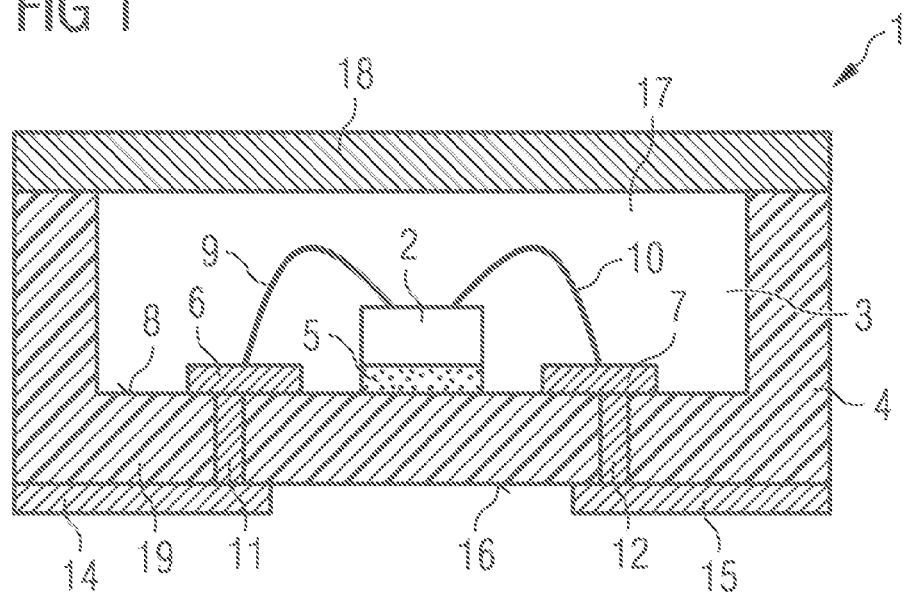
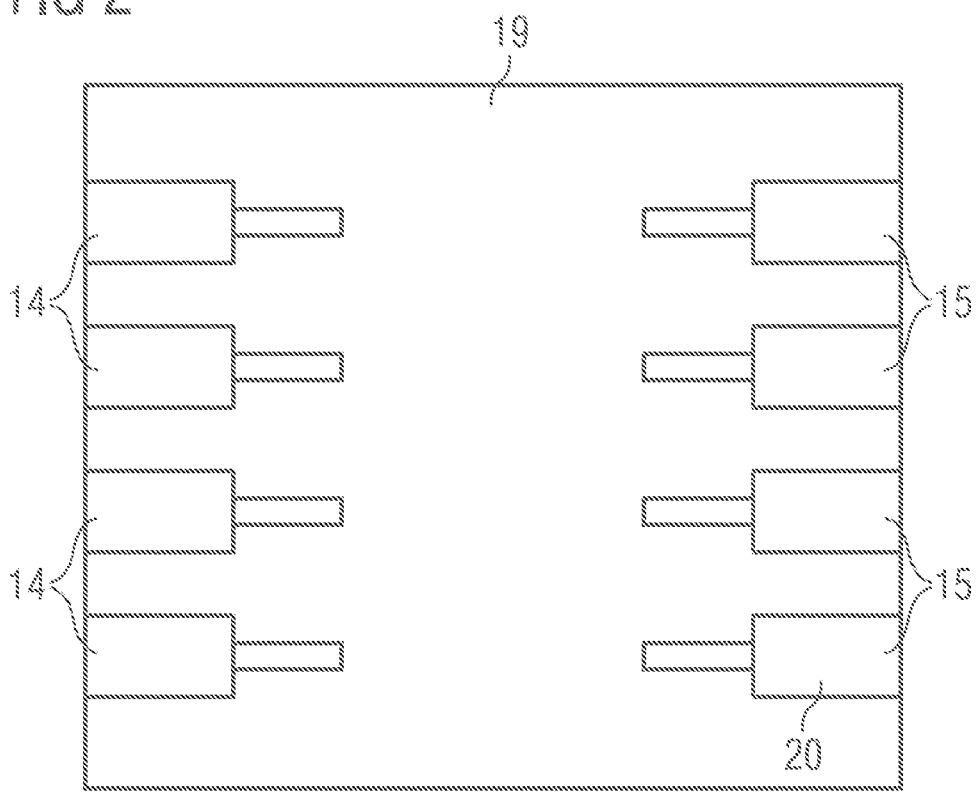

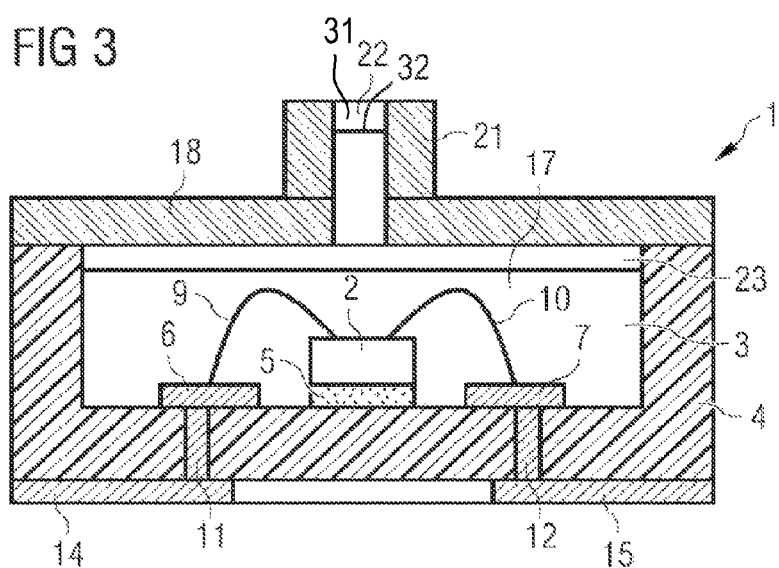
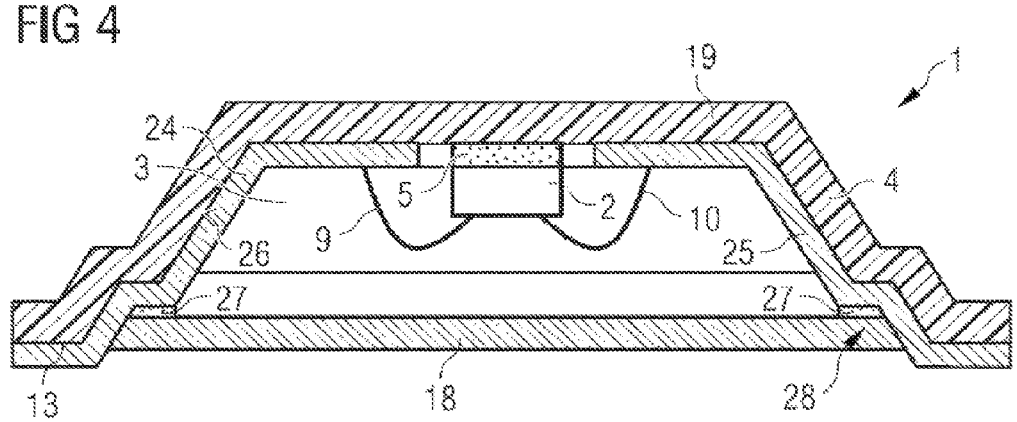

HOUSING FOR A SEMICONDUCTOR CHIP AND SEMICONDUCTOR CHIP WITH A HOUSING

This patent application is a national phase filing under section 371 of PCT/EP2012/064724, filed Jul. 26, 2012, which claims the priority of German patent application 10 2011 109 006.5, filed Jul. 29, 2011, each of which is incorporated herein by reference in its entirety.

TECHNICAL FIELD

A housing for a semiconductor chip is specified.

BACKGROUND

A housing can protect a semiconductor chip against damage, for example, against mechanical or chemical external influences. A semiconductor chip with a housing is furthermore specified. The semiconductor chip is designed, for example, for measuring pressure. Alternatively, the semiconductor chip can be designed, for example, as an inertial sensor, in particular, for measuring acceleration. Alternatively, the semiconductor chip can be designed for example as a magnetic sensor, for example, for measuring rotational speeds. Alternatively, the semiconductor chip can be designed, for example, as a combination of two or more sensor types from a pressure sensor, an inertial sensor or a magnetic sensor.

SUMMARY OF THE INVENTION

Embodiments of the invention specify a housing for a semiconductor chip and a semiconductor chip with a housing, wherein the housing has improved properties.

A housing for a semiconductor chip is specified, wherein the housing has an injection-molded body, in which an accommodating area for accommodating the semiconductor chip is provided. The injection-molded body has at least one metallization for making electrical contact with the semiconductor chip.

The injection-molded body thus simultaneously fulfills the function of a housing for the semiconductor chip and the function of a circuit carrier for making electrical contact with the semiconductor chip. The number of components required for forming a housing and a circuit carrier can be reduced in this way. Moreover, particularly small manufacturing tolerances can be obtained in the case of such a housing.

Preferably, the injection-molded body is designed as a "molded interconnect device," MID for short. Preferably, the injection-molded body comprises at least two different material components, wherein one material is metallizable and the other material is non-metallizable. The metallizations can be applied to the metallizable material. Both materials are preferably non-conducting materials.

Preferably, the injection-molded body comprises a plastics material. Particularly preferably, the injection-molded body comprises a component of a non-metallizable plastic and a component of a metallizable plastic.

The body is produced in a two-component injection-molding method, for example. In this case, a main body can be molded from a first material in a first injection-molding step and a second material can be applied to the main body in a second injection-molding step. The metallizations can subsequently be applied to the metallizable material, which is preferably the second material.

Preferably, the housing is embodied in such a way that a semiconductor chip arranged in the accommodating area is surrounded completely by the injection-molded body or is surrounded by the housing apart from an open side of the injection-molded body, i.e., in five spatial directions. By way of example, the accommodating area is embodied as a depression in the injection-molded body. The injection-molded body can have the shape of a parallelepiped that is open on one side face. The shape of the injection-molded body is preferably adapted to the respective area of use.

The housing preferably has a base embodied in such a way that the semiconductor chip can be fixed to it. Preferably, the base is a part of the injection-molded body. By way of example, the semiconductor chip can be fixed to the base by means of an adhesive.

In one embodiment of the housing, the metallization is arranged at least partly on a surface of the injection-molded body.

The metallization can be arranged at least partly in the accommodating area of the housing.

By way of example, the metallization is provided on a base of the housing in the accommodating area. Preferably, the metallization is arranged in such a way that a semiconductor chip can be fixed on the base of the housing and electrically connected to the metallization. The electrical connection of the semiconductor chip to the metallization can be produced by a wiring, for example, which leads from electrical contacts of the semiconductor chip to the metallization. By way of example, wires can be soldered to the metallization.

The metallization can be arranged at least partly outside the accommodating area.

By way of example, the metallization can be arranged on an outer surface of the housing, for example, on an outer surface of the base of the housing. Preferably, the metallization arranged outside the accommodating area serves for externally making electrical contact with the semiconductor chip. By way of example, the metallization arranged outside the accommodating area can have an electrical connection, e.g., in the form of a contact pin or a contact pad. By way of example, contact pins can also be formed by a corresponding shaping of the injection-molded body and of a metallization. In this case, there is no need for separate contact pins to be fixed to the housing.

By way of example, the housing is embodied in such a way that it can be placed onto a printed circuit board. For the electrical connection of the semiconductor chip, a metallization of the housing can be electrically connected to a conductor track of the printed circuit board. Preferably, the housing has a metallization which is arranged on an outer surface of the housing, and the housing is embodied in such a way that it can be placed onto the printed circuit board by the side on which the metallization is arranged. In this case, the metallizations can be electrically connected to the printed circuit board without additional fitting of connecting wires. By way of example, a metallization of the housing is soldered to a conductor track of the printed circuit board.

Particularly preferably, the housing has at least one metallization on a surface of the injection-molded body in the accommodating area and at least one metallization on an outer surface of the injection-molded body, wherein the metallizations are electrically connected to one another. This enables electrical contact to be made with the semiconductor chip externally.

In one embodiment, the metallization leads at least partly through the injection-molded body.

Preferably, the metallization forms a plated-through hole of the injection-molded body, that is to say that it leads completely through a wall of the injection-molded body. Such a plated-through hole produces an electrical connection from the exterior to the interior of the body and thus enables electrical contact to be made with the semiconductor chip from outside the housing. A particularly impermeable housing can be realized in the case of a plated-through hole.

In one embodiment, the injection-molded body has at least one metallization which is arranged in the accommodating area. By way of example, said metallization is arranged on an inner surface of the body. Moreover, the injection-molded body has at least one metallization which is embodied as plated-through hole and leads through the injection-molded body. Moreover, the body has at least one metallization which is arranged outside the accommodating area. Preferably, said metallization is arranged on an outer surface of the injection-molded body. The plated-through hole connects the metallization in the accommodating area to the metallization outside the accommodating area.

In a further embodiment, the metallization is provided at least partly in the accommodating area and leads out of the accommodating area along a surface of the injection-molded body.

In this case, the body is preferably free of plated-through holes. By way of example, the body has an open side, through which the metallization is led from the accommodating area to an exterior. In this embodiment, the electrical contact-making can be produced in a particularly simple manner since there is no need to produce a plated-through hole.

In one embodiment, the housing has a cover for closing the accommodating area.

The cover can comprise a plastics material. Preferably, the cover is fixed to the injection-molded body of the housing. By way of example, the cover can be fixed to the injection-molded body by an adhesive or by means of ultrasonic welding. A connection by means of ultrasonic welding has the advantage that a particularly impermeable housing can be realized.

By way of example, in the case of contact-making in which metallizations are led along the surface of the body toward the outside, the metallization leads through between the cover and the body. In this case, the housing can be mounted on a printed circuit board in such a way that the cover of the housing adjoins the printed circuit board.

In an alternative embodiment, the housing is free of a cover. By way of example, a metallization can then lead out of the interior at an open side of the body.

In one embodiment, the housing has a potting compound which at least partly fills the accommodating area.

Preferably, the potting compound is embodied in such a way that the semiconductor chip is completely surrounded by the potting compound. In this case, completely should be understood such that the semiconductor chip can be free of the potting compound in a region in which it is fixed to the housing. Preferably, the potting compound brings about a passivation of the semiconductor chip and of connecting wires of the semiconductor chip.

In one embodiment, the housing has a cover and a potting compound. The potting compound for example fills the accommodating area of the housing completely, i.e., as far as the cover of the housing. The accommodating area of the housing can be sealed particularly well in this way. Alternatively, the potting compound can fill the accommodating area of the housing only partly. By way of example, the potting compound leaves free a clearance to the cover.

In one embodiment, the housing is free of a cover. In this embodiment, the semiconductor chip can be protected solely by the potting compound.

Preferably, the housing is embodied in such a way that the accommodating area is hermetically impermeably sealed.

For a hermetically impermeable closure, a cover of the housing is preferably connected to the housing body particularly impermeably. By way of example, the cover is fixed to the housing by means of ultrasonic welding. Furthermore, a particularly good sealing of the housing can be achieved by a metallization embodied as plated-through hole.

In one embodiment, the housing has an opening. By way of example, the opening leads into the accommodating area. By way of example, the opening can be embodied as a feed line for a medium, in particular a fluid medium or a gaseous medium. By way of example, the opening can serve for pressure equalization, in particular between the accommodating area and the environment. In particular, the opening can serve for ventilating the accommodating area. Alternatively, the opening can serve for filling the accommodating area with a medium, for example, an oil. This can serve for protecting the sensor. By way of example, the sensor can be protected against dust or other dirt particles by the oil.

The opening can lead into the accommodating area at one side of the housing, and one or a plurality of metallizations can lead out of the accommodating area at another side. By way of example, the metallizations can lead out of the accommodating area at an opposite side relative to the opening. By way of example, the opening can be arranged in a cover and one or a plurality of metallizations can be arranged on or in a housing base. In particular, the metallizations can lead through the housing base. Alternatively, the opening can be arranged in a housing base, and one or a plurality of metallizations can lead out of the accommodating area at a side at which a cover is arranged. In particular, one or a plurality of metallizations can run along the housing wall. In particular, one or a plurality of metallizations can lead along the housing wall toward the outside.

Furthermore, the opening can be closed with a membrane. In particular, the opening can be closed with a semi-permeable membrane. By way of example, the membrane can be embodied as gas-permeable and fluid-tight. Alternatively or additionally, the membrane can be permeable in one direction and not in another direction. By way of example, a ventilation of the accommodating area can take place by this means. By way of example, the membrane can be embodied as permeable in such a way that no excess pressure arises in the accommodating area.

Furthermore, a valve can be arranged at the opening. By way of example, the valve can allow passage for a fluid medium or a gaseous medium only in one direction. Alternatively or additionally, the valve can regulate a flow rate of the medium. By way of example, exchange of a gaseous or liquid medium can take place in an opened state of the valve. By way of example, the accommodating area can be impermeably sealed in a closed state of the valve.

A semiconductor chip with a housing is furthermore specified. The housing can have all the above-described functional and structural features of a housing. The housing has an injection-molded body with an accommodating area, wherein the semiconductor chip is arranged in the accommodating area.

Preferably, the semiconductor chip is fixed to a base of the injection-molded body. The semiconductor chip and the associated housing can be designed for measuring a pressure. Alternatively, the semiconductor chip can be designed for measuring an acceleration. Alternatively, the semiconductor chip can be designed for measuring a rotational speed. By way of example, the semiconductor chip can be designed as a magnetic sensor. In this case, the housing can be adapted to the respective function of the semiconductor chip. Preferably, the at least one metallization runs on the injection-molded body on an area on which the semiconductor chip is arranged. Alternatively, the at least one metallization leads through the area on which the semiconductor chip is arranged. By way of example, the injection-molded body is designed as an MID.

By way of example, the semiconductor chip with its housing is designed for measuring an absolute pressure. In a further embodiment, the semiconductor chip and the housing can be designed for measuring a relative pressure. The housing has a connection region, for example, through which leads a feed line for a fluid medium. The feed line preferably leads toward a pressure-sensitive region of the semiconductor chip, such that the pressure of the fluid medium is measurable by means of the semiconductor chip. By way of example, a membrane or a valve is arranged at the feed line.

BRIEF DESCRIPTION OF THE DRAWINGS

The subjects described here are explained in greater detail below on the basis of schematic exemplary embodiments which are not true to scale. In the figures:

FIG. 1 shows a sectional view of a first embodiment of a housing;

FIG. 2 shows a plan view from outside on the base of the housing from FIG. 1;

FIG. 3 shows a sectional view of a second embodiment of a housing;

FIG. 4 shows a sectional view of a third embodiment of a housing;

In the following figures, identical reference signs refer to functionally or structurally corresponding parts of the different embodiments.

DETAILED DESCRIPTION OF ILLUSTRATIVE EMBODIMENTS

Figure 5:
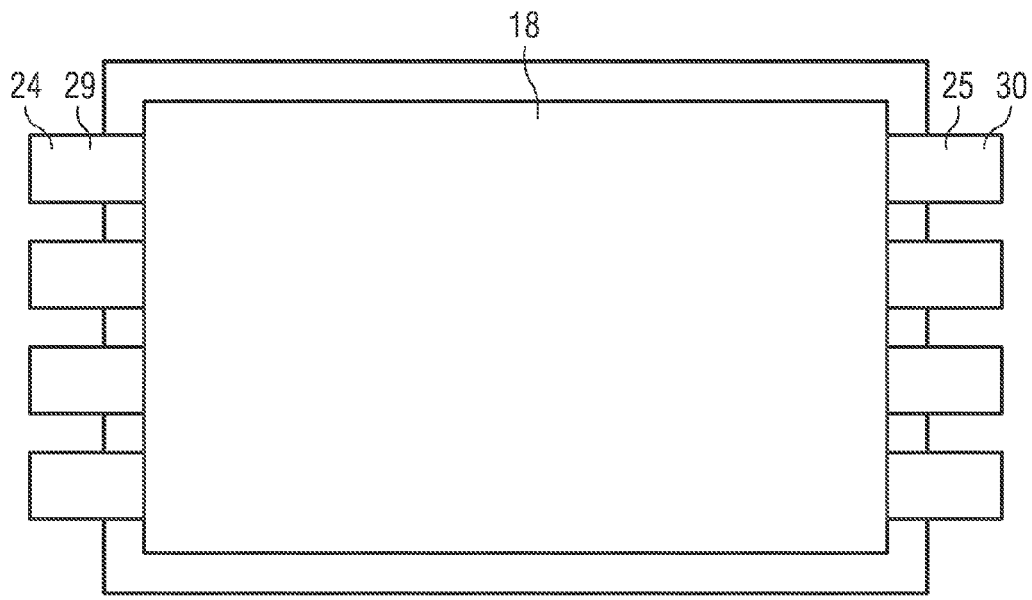
FIG. 5 shows a plan view from outside on the cover of the housing from FIG. 4.

FIG. 1 shows a housing 1 for a semiconductor chip 2. The semiconductor chip is arranged in an accommodating area 3 of the housing 1.

The housing 1 has an injection-molded body 4, which is produced from a plastics material in an injection-molding method. The injection-molded body 4 has metallizations 6, 7, 11, 12, 14, 15 for making contact with the semiconductor chip.

The injection-molded body 4 thus has both the function of a housing for the semiconductor chip 2 and the function of a circuit carrier and is designed as an MID.

The semiconductor chip 2 is fixed to the base 19 of the injection-molded body 4, for example, by means of an adhesive 5.

The housing has inner metallizations 6, 7, which are provided on a surface 8 of the injection-molded body 4 in the accommodating area 3 of the housing 1. The housing has further inner metallizations, which are concealed by the inner metallizations in FIG. 1 and, therefore, cannot be seen here. The inner metallizations 6, 7 are electrically connected to the semiconductor chip 2 via connecting wires 9, 10.

The housing 1 has further metallizations, embodied as plated-through holes 11, 12. The plated-through holes 11, 12 are electrically connected to a respective inner metallization 6, 7 and lead through the injection-molded body 4. The plated-through holes 11, 12 thus produce an electrical connection of the inner metallization 6, 7 to an outer side 13 of the housing 1.

Outer metallizations 14, 15 are provided on the outer side 13 of the housing and are in direct electrical contact with the plated-through holes 11, 12. The outer metallizations 14, 15 are arranged on an outer surface 16 of the housing 1. This enables electrical contact to be made with the semiconductor chip 2 externally. The housing 1 can be placed onto a printed circuit board (not shown here) and electrically connected thereto. In particular, it can be placed onto the printed circuit board in such a way that the outer metallizations 14, 15 bear on the printed circuit board.

In order to produce the plated-through holes 11, 12, feedthroughs are formed in the body 4 preferably as early as in the injection-molding method in which the injection-molded body 4 is produced. In this case, the material of the body 4 through which the feedthroughs are led is preferably a metallizable plastic. Afterward, the feedthroughs are filled with a metallic material, such that the inner metallizations 6, 7 are formed.

In order to produce the inner metallizations 6, 7 and the outer metallizations 14, 15, preferably, after the injection molding of the injection-molded body 4, a metallic material is applied to an inner surface 8 and an outer surface 16 of the body 4. In this case, the regions of the surfaces 8, 16 of the body 4 at which the inner metallizations 6, 7 and the outer metallizations 14, 15 are formed are preferably composed of a metallizable plastic. An arrangement of the metallizations, in particular a conductor track structure, can thus be defined by the arrangement of the metallizable plastic.

Preferably, the injection-molded body 4 comprises a metallizable plastic at the locations to which a metallization is intended to be applied, and a non-metallizable plastic at the locations which are intended to be free of a metallization. By way of example, such a body 4 is produced in a two-component injection-molding method.

The accommodating area 3 of the housing 1 is filled with a potting compound 17. A passivation of the semiconductor chip 2 can be produced in this way. By way of example, the potting compound comprises a soft gel.

The housing 1 has a cover 18, which seals the accommodating area 3 toward the outside. The cover 18 is fixed to the injection-molded body 4.

By way of example, the cover 4 is formed from a plastics material. The cover 4 can be fixed to the injection-molded body 4 by means of adhesive bonding or ultrasonic welding. A connection by means of ultrasonic welding has the advantage that a particularly impermeable housing 1 can be realized in this way. Preferably, the housing 1 is hermetically impermeably sealed.

FIG. 2 shows a plan view from outside on the base 19 of the housing 1, on which the outer metallizations 14, 15 are applied. The outer metallizations 14, 15 have connection pads 20 for making electrical contact with the semiconductor chip. The connection pads 20 can be soldered, for example, to a conductor track structure of a printed circuit board. Eight outer metallizations 14, 15 and eight connection pads 20 are depicted in the figure.

FIG. 3 shows a second embodiment of a housing 1, in which second embodiment the electrical contact-making of the semiconductor chip 2 is embodied as in the first embodiment in accordance with FIG. 1. The semiconductor chip 2 and the associated housing 1 are designed, for example, for measuring an absolute pressure. Alternatively, the semiconductor chip 2 can be designed for measuring acceleration or for measuring rotational speed. By way of example, the semiconductor chip 2 can be designed as a magnetic sensor. The housing 1 can be adapted to the respective functionality.

The housing 1 has an opening 31 leading into the accommodating area 3. By way of example, the cover 18 has an opening 31. By way of example, the opening 31 is embodied as a connection region 21, through which leads a feed line 22, for example, for a fluid medium whose pressure is intended to be determined. By way of example, the feed line 22 is filled with air. Alternatively, ventilation of the accommodating area 3 can take place via the opening 31. In particular, pressure equalization with the environment can take place. In one embodiment, the opening 31 can be provided with a membrane or a valve. By way of example, the membrane can be embodied as semi-permeable.

The accommodating area 3 of the housing 1 is partly filled with a potting compound 17. The potting compound 17 does not fill the accommodating area 3 as far as the cover 18. A clearance 23 is provided between the underside of the cover 18 and the potting compound 17. The clearance 23 is filled with air, for example. Alternatively, the potting compound 17 can completely fill the accommodating area 3 of the housing 1. This enables particularly good sealing and passivation of the semiconductor chip 2.

The base 19 of the housing is embodied in the same way as the base 19—shown in FIG. 2—of the housing from FIG. 1.

FIG. 4 shows a third variant of a housing 1 for a semiconductor chip 2. In this embodiment, the electrical contact-making of the semiconductor chip 2 is obtained by means of metallizations 24, 25, which are arranged at a surface 26 of the injection-molded body 4 and lead along the surface 26 from the accommodating area 3 to an outer side 13 of the body. The electrical contact-making is thus free of plated-through holes leading through the injection-molded body 4.

The metallizations 24, 25 lead out of the accommodating area 3 on that side of the housing 1 on which the cover 18 of the housing 1 is arranged. Consequently, in this embodiment, the outer electrical connection of the semiconductor chip 2 is provided on the other side relative to the accommodating area 3 of the housing 1 in comparison with the embodiment in accordance with FIGS. 1 and 3.

The injection-molded body 4 of the housing 1 is embodied in a stepped fashion at the side at which the cover 18 is arranged, thus forming an accommodating region 28 for the cover 18. The cover 18 of the housing 1 is fixed to the injection-molded body 4 by an adhesive 27 in the accommodating region 28. The accommodating region 28 ensures a particularly good positioning of the cover 18 relative to the body 4 and particularly good sealing of the accommodating area 3.

FIG. 5 shows a plan view from outside on the cover 18 of the housing 1. The injection-molded body 4 is embodied in such a way that connection pins 29, 30 are formed from parts of the body 4 that are provided with metallizations 24, 25. The housing 1 can be placed onto a printed circuit board, such that the connection pins 29, 30 adjoin the printed circuit board and can be electrically contact-connected to conductor tracks of the printed circuit board. Consequently, in the case of such mounting, the cover 18 of the housing 1 adjoins the printed circuit board, while the base 19 faces away from the printed circuit board.

Figure 6:
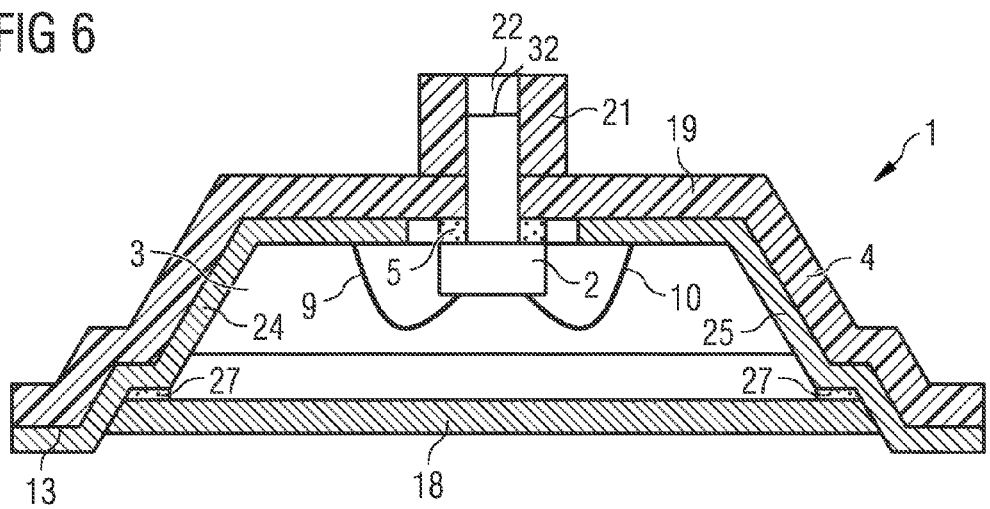
FIG. 6 shows a sectional view of a fourth embodiment of the housing.

FIG. 6 shows a fourth embodiment of a housing 1 for a semiconductor chip 2. The semiconductor chip 2 and the housing 1 are designed, for example, for a measurement of a relative pressure, that is to say as a relative pressure sensor. In this case, the pressure of a fluid medium, e.g., air, which is led in the feed line to a pressure-sensitive region of the semiconductor chip 2, relative to the ambient pressure of the semiconductor chip 2 is determined. The potting compound is embodied in such a way that an ambient pressure can be transmitted to the semiconductor chip 2. Alternatively, the semiconductor chip 2 and the housing 1 are designed for measuring acceleration, in particular as an inertial sensor, or for measuring rotational speed, in particular as a magnetic sensor.

The housing 1 has, on the opposite side relative to the cover 18, a connection region 21 with a feed line 22 for feeding a fluid medium onto the semiconductor chip 2. The semiconductor chip 2 is fixed to the housing 1 below the feed line 22 by means of an adhesive 5. In this embodiment, a membrane or a valve 32 is arranged at the feed line 22.

By way of example, a part of the injection-molded body 4 or the cover 18 can be provided with one or a plurality of holes through which the ambient pressure of the housing is transmitted to a pressure-sensitive region of the semiconductor chip 2. In this case, it is possible to determine a pressure of a fluid medium led in the feed line 22 relative to the ambient pressure of the housing 1.

The electrical contact-making of the semiconductor chip 2 is embodied like the electrical contact-making of the embodiment in accordance with FIGS. 4 and 5.

The invention claimed is:

1. A housing for a semiconductor chip, the housing comprising:
    an injection-molded body, in which an accommodating area for accommodating the semiconductor chip is provided, wherein the injection-molded body has a metallization configured to make electrical contact with the semiconductor chip; and
    an opening leading into the accommodating area, wherein the opening is closed by a membrane or a valve.

2. The housing according to claim 1, wherein the metallization is arranged at least partly on a surface of the injection-molded body.

3. The housing according to claim 1, wherein the metallization is arranged at least partly in the accommodating area.

4. The housing according to claim 1, wherein the metallization leads at least partly through the injection-molded body.

5. The housing according to claim 1, wherein the metallization is arranged at least partly outside the accommodating area.

6. The housing according to claim 1, wherein the injection-molded body has a metallization arranged in the accommodating area, has a metallization embodied as plated-through hole leading through the injection-molded body, and has a metallization arranged outside the accommodating area, wherein the plated-through hole electrically connects the metallization in the accommodating area to the metallization outside the accommodating area.

7. The housing according to claim 1, wherein the metallization is provided at least partly in the accommodating area and leads out of the accommodating area along a surface of the injection-molded body.

8. The housing according to claim 1, further comprising a cover configured to close the accommodating area.

9. The housing according to claim 1, wherein the metallization leads out of the accommodating area, wherein the opening leads into the accommodating area at one side of the housing, and wherein the metallization leads out of the accommodating area at another side.

10. A semiconductor chip with a housing according to claim 1, wherein the semiconductor chip is arranged in the accommodating area of the housing.

11. The housing according to claim 1, further comprising a cover, wherein the cover is located opposite to a connection region, and wherein the connection region comprises a feed line configured to feed a fluid medium onto the semiconductor chip.

12. The housing according to claim 1, wherein the injection-molded body is designed as an molded interconnect device (MID).

13. The housing according to claim 8, wherein the accommodating area is hermetically impermeably sealed.

14. The housing according to claim 9, further comprising a cover that closes the accommodating area, wherein the opening is arranged in the cover, and the metallization is arranged at a base of the housing.

15. The housing according to claim 9, further comprising a cover that closes the accommodating area, wherein the opening is arranged in a base of the housing and the metallization is arranged at a side at which the cover is arranged.

16. The semiconductor chip according to claim 10, wherein the semiconductor chip is configured to measure a pressure.

17. A device comprising:
a semiconductor chip;
an injection-molded body, in which an accommodating area for accommodating the semiconductor chip is provided, wherein the injection-molded body has a metallization configured to make electrical contact with the semiconductor chip; and
an opening leading into the accommodating area, wherein the opening is closed by a membrane or a valve.

18. A device comprising:
an injection-molded body having an accommodating area;
a semiconductor chip attached to the accommodating area of the injection-molded body;
a metallization physically attached to the injection-molded body and electrically coupled to the semiconductor chip;
an adhesive attaching the semiconductor chip to the accommodating area; and
a cover closing the accommodating area to hermetically seal the semiconductor chip within the injection-molded body; and
an opening leading into the accommodating area, wherein the opening is closed by a membrane or a valve.

19. The device according to claim 18, wherein the device is configured to measure pressure.

20. The device according to claim 18, wherein the metallization comprises a first region within the accommodating area, a second region extending through the injection-molded body and a third region at an outer surface of the injection-molded body.

* * * * *